United States Patent [19]
Penn et al.

[11] 3,781,176
[45] Dec. 25, 1973

[54] THERMOELECTRIC UNITS

[75] Inventors: Alan William Penn, Reading; Frank Beighbour, Wantage, both of England

[73] Assignee: United Kingdom Atomic Energy Authority, London, England

[22] Filed: Jan. 25, 1971

[21] Appl. No.: 109,486

[30] Foreign Application Priority Data

Jan. 30, 1970 Great Britain ..................... 4,729/70

[52] U.S. Cl...................... 136/212, 29/573, 136/201
[51] Int. Cl............................................... H01v 1/32
[58] Field of Search.................... 136/201, 203–205, 136/208, 211, 212, 225, 230; 29/573

[56] References Cited

UNITED STATES PATENTS

| | | | |
|---|---|---|---|
| 3,509,620 | 5/1970 | Phillips | 136/211 |
| 2,886,475 | 5/1959 | McKay | 136/225 |
| 3,626,583 | 12/1971 | Abbott et al. | 136/212 |

FOREIGN PATENTS OR APPLICATIONS

| | | | |
|---|---|---|---|
| 1,130,334 | 10/1968 | Great Britain | 136/201 |

*Primary Examiner*—Harvey E. Behrend
*Attorney*—Larson, Taylor & Hinds

[57] ABSTRACT

To provide for connection of electrical leads a metal strip is secured by adhesive to the side of a thermoelectric unit comprising an assembly of thermoelectric elements. Insulating material is interposed between the metal strip and the unit. An end face of the metal strip is formed flush with the end faces of the thermoelectric elements. An electrically conductive bridge is formed from the end face of the metal strip to an appropriate end face of a thermoelectric unit.

7 Claims, 7 Drawing Figures

PATENTED DEC 25 1973

3,781,176

SHEET 1 OF 3

THERMOELECTRIC UNITS

BACKGROUND OF THE INVENTION

The invention relates to the connection of electrical leads to a thermoelectric unit.

SUMMARY OF THE INVENTION

The invention provides a method of connecting electrical leads to a thermoelectric unit comprising an assembly of thermoelectric elements, which method comprises securing to a side of the unit an electrically conductive member with electrically insulating material interposed between the conductive member and the unit and with one face of the member flush with the faces of the thermoelectric elements at one end of the unit, and forming an electrically conductive bridge from the said one face of the member across to an end face of one of the thermoelectric elements.

Preferably the electrically conductive bridge is formed simultaneously with the formation of electrically conductive bridges connecting together pairs of the thermoelectric elements as a series of thermocouples in a modular unit.

The invention includes a thermoelectric unit when made by the aforesaid method. Preferably the unit has two electrical leads connected respectively via two electrically conductive members attached and connected as aforesaid.

Such a thermoelectric unit is particularly suitable for use in a battery for a cardiac pacemaker. In this case, the electrically conductive bridges are preferably provided solely by gold deposited by vacuum evaporation. This may be effected by first superimposing a mask upon the exposed end faces of the thermoelectric elements and the said face of the electrically conductive member, or the faces of the electrically conductive members, the mask having openings corresponding with the desired location and extent of the electrically conductive bridges, and then forming the electrically conductive bridges by vacuum deposition of gold.

BRIEF DESCRIPTION OF THE DRAWINGS

A specific method of manufacture and construction of thermoelectric battery for a cardiac pacemaker embodying the invention will now be described by way of example and with reference to the accompanying drawings, in which.

DESCRIPTION OF PREFERRED EMBODIMENT

Figure 1:
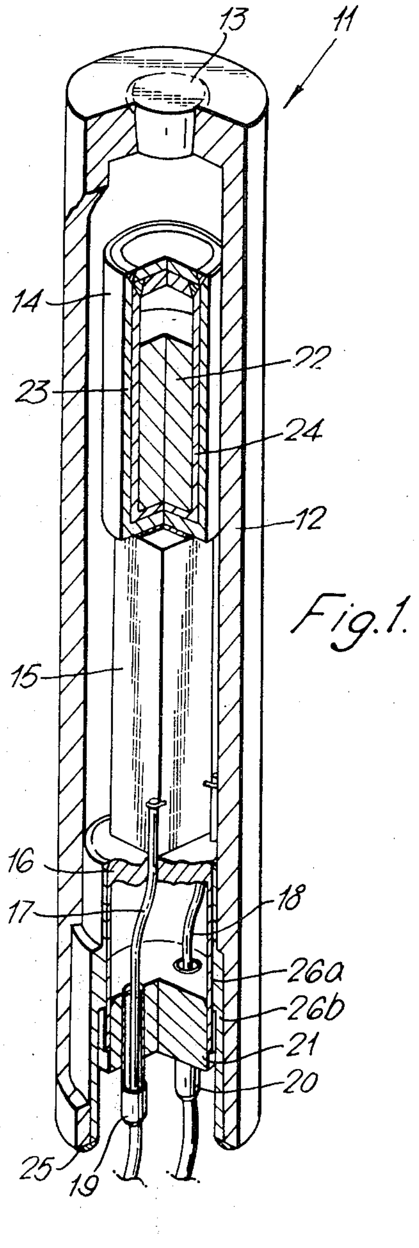
FIG. 1 is a diagrammatic perspective view of the battery, cut away to reveal its components.

Referring to FIG. 1, the thermoelectric battery 11 comprises a stainless steel cylindrical outer casing 12 adapted, by means of a plug 13, for hermetic sealing with the interior under vacuum or filled with a selected inert gas. The final seal is made by welding the plug 13 in position.

In the container 12 are a heat source 14, a modular thermoelectric unit 15, a metal heat sink disc 16 and electrical leads 17, 18 extending out through seals 19, 20 in an alumina plug 21.

The heat source 14 comprises a charge 22 of plutonium-238 contained in a small cylindrical can 23 of Hastelloy steel which is shown lined internally at 24. The lining 24 may, however, be necessary. In this example the heat source 14 is bonded to one end face of the thermoelectric unit 15.

The cold end of the thermoelectric unit 15 is bonded with adhesive to the metal heat sink disc 16, which conducts the rejected heat to the container 12. The disc 16 is tightly fitted to the alumina seal assembly, which comprises the alumina plug 21 and a composite metal cylinder *26a/26b*. The alumina plug 21 serves both as electrical insulator and vacuum sealing plug and is brazed to the composite metal cylinder *26a/26b*. The seal is completed by welding at 25 the composite metal cylinder *26a/26b* to the container 12. The electrical leads 17 and 18 are also sealed in a similar manner and are insulated from the metal disc 16 by small alumina ring inserts (not shown).

Figures 2, 3, 4:
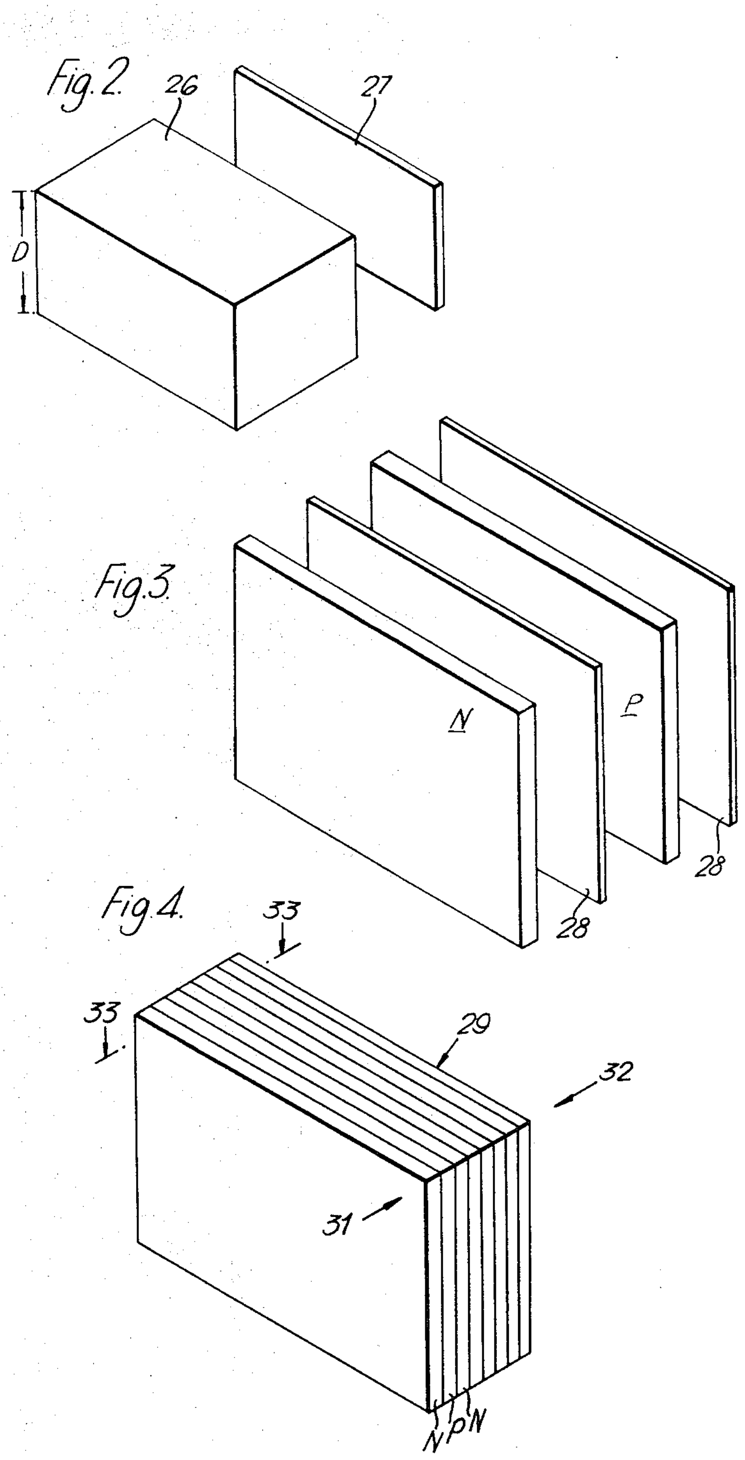

The manufacture of a thermoelectric unit 15 starts from two blocks, such as 26 shown in FIG. 2, of bismuth telluride based semiconductor material. In one block, the bismuth telluride is doped so that the semiconductor material is N-type. In the other block, the bismuth telluride is doped so that the semiconductor material is P-type. The blocks 26 are initially formed, by a powder pressing technique, with one dimension, the dimension marked "D" in FIG. 2, equal to the desired height of the final thermoelectric unit 15.

The blocks 26 are then sliced into thin rectangular plates 27, one side of which corresponds with the dimension D. The thermoelectric unit 15 ultimately formed is composed of a plurality of rectangular section rods of thermoelectric material, which is 0.015 in. square in cross-section. The thickness of the slices 27 thus has to be 0.015 in.

Eight slices of alternately N-type and P-type semiconductor material are laid up as shown in FIG. 3 with a thin sheet of cellular material 28 interposed between each of the slices of semiconductor material. In this example, the cellular material comprises cigarette paper. The paper sheets 28 are impregnated with epoxy resin and the assembly of slices of semiconductor material and paper sheets is pressed together to form a sandwich block 29 as indicated in FIG. 4.

Whilst the epoxy resin is still capable of plastic flow, pressure is applied to the block 29 as indicated by the arrows 31, 32. The pressure applied is sufficient for the separation of adjacent slices of semiconductor material to be determined by the interposed paper sheets without uncertain variation due to the formation of intervening films of epoxy resin. In practice, the required pressure is achieved by increasing the pressure until further increases in pressure do not significantly reduce the thickness of the sandwich block 29. Under these conditions, the epoxy resin occupies the pores in the paper so that the spacing between adjacent semiconductor slices is accurately set by the thickness of the paper sheets 28. The applied pressure is maintained until the epoxy resin has set.

The block 29 is then cut along planes perpendicular to the planes of the semiconductor slices forming the block 29 and parallel with the dimension D. The line and direction of cut is indicated by the arrows 33 in FIG. 4.

Figure 5:
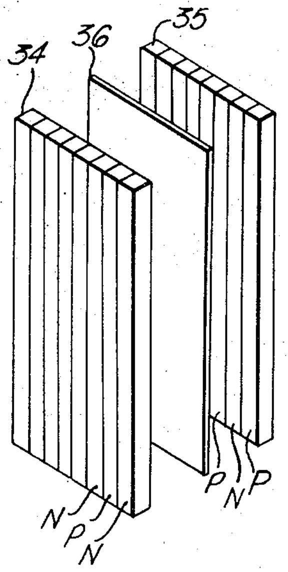
FIG. 2 to FIG. 7 illustrate stages in the manufacture of part of the thermoelectric battery.

The block 29 is thus cut into a plurality of slices, of which two are illustrated at 34 and 35 in FIG. 5. These slices 34 and 35 are cut, in this example, with a thickness of 0.015 in. and thus comprise a row of eight rods of alternately N- and P-type semiconductor material secured together but spaced from one another by insulating strips of paper which define an accurate and uniform separation between adjacent rods.

Eight slices from the block 29 are assembled with intervening sheets of cigarette paper 36 in the manner illustrated for two slices in FIG. 5. Each alternate slice is reversed so that an N-type semiconductor rod is one slice is adjacent a P-type semiconductor rod in the adjacent slice. The sheets of paper 36 are impregnated with epoxy resin, the assembly is pressed into a block as shown in FIG. 6 and, again, pressure is applied to ensure that the separation of adjacent slices such as 34 and 35 is determined by the paper without uncertain variation due to the formation of intervening films of epoxy resin.

Figure 6:
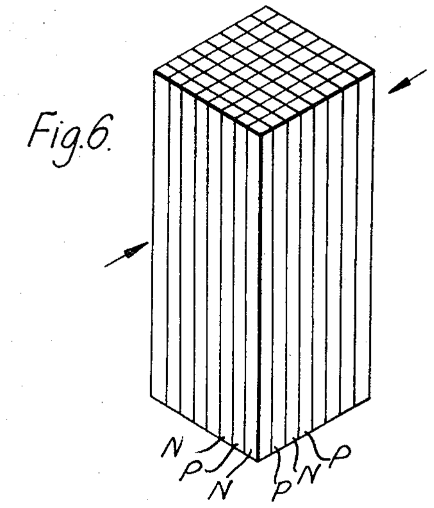

In order to provide for making electrical connection to the thermopile which is eventually to be provided by the block shown in FIG. 6, two strips of nickel are secured to one side of the block, each strip of nickel having an end face substantially flush with the end surface of the block which is to be the cold end of the thermopile to be formed by the block. These nickel strips are illustrated at 37 and 38 in FIG. 7, which is a plan view of the block shown in FIG. 6. The nickel strips 37 and 38 have interposed between them and the block a sheet of paper in order to electrically insulate the nickel strips from the block. The paper is impregnated with epoxy resin so that the attachment of the nickel strips to the block is the same as the attachment of the slices of the block to one another. In this example, the nickel strips are attached at the same stage as the FIG. 5 and FIG. 6 assembly of slices into the final block. This procedure reduces the number of pressing operations, but if desired, the nickel strips 37 and 38 may be bonded to the block as a subsequent operation.

Both ends of the block are then lapped flat, care being taken at the cold end to ensure that the end faces of the nickel strips 37 and 38 are accurately flush with the end surfaces of the thermoelectric rods.

Figure 7:
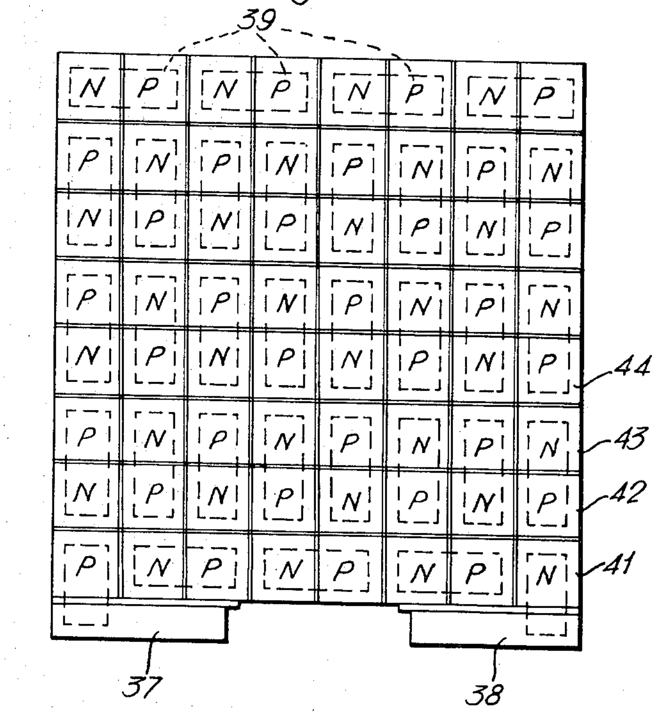

FIG. 7 shows the relative disposition of N- and P-type semiconductor rods in the block and a mask is then registered with both end surfaces of the block by a photorsist technique. FIG. 7 illustrates the cold end and the mask is arranged to leave uncovered the regions within the dotted rectangles 39.

These uncovered regions 39 mark the location and extent of electrically conductive bridges which are to be formed connecting together the thermoelectric rods in the block to form a series array of thermocouples. For this, it will be appreciated that the pattern of uncovered regions on the reverse end of the block, the end which is to be the hot end in operation, will be similar to that at the cold end as shown in FIG. 7, but displaced so that, for example, the rod 41 is connected to rod 42 at the hot end, and the rod 43 is connected to the rod 44 and so on.

The block is then mounted in a vacuum furnace adjacent a boat containing pure gold and, after evacuation, the gold is heated so that gold evaporates and forms a deposit in the uncovered regions on the ends of the block. In this way, thin layer gold bridges are formed to make the required electrical connection between the semiconductor rods forming the thermoelectric elements of the block. Unexpectedly, thin gold layers formed in this way directly onto the bismuth telluride alloy have satisfactory adhesion, do not produce serious poisoning of the bismuth telluride and are adequate to carry the electrical current in a unit of the small size of this xample. The maximum size unit to which this technique for forming the electrically conducting bridges is applicable may be specified as a maximum bridge current and this is assessed to be of the order of $10^{-1}$ amps.

It will be appreciated that the necessary accurate location of the bridges, which s dependent upon the formation of the mask, is facilitated by the accurate and uniform spacing of the thermoelectric rods achieved by the technique described above for manufacturing the block. It will also be appreciated that connection of electrical leads to the two ends of the series array of thermocouples is greatly simplified by the technique of attaching nickel strips to the side of the block and making a gold bridging connection from these to the end thermocouple elements at the same time as the other conducting bridges are formed.

A further important feature of the thermoelectric unit of this example is that the bismuth telluride based alloys from which the elements are formed are so manufactured that the grain size of the alloys is significantly less than the cross-sectional size of the thermoelectric elements. It has been appreciated that if the grain size of the alloy is not less than the cross-sectional size of the elements, the elements are liable to have poor mechanical strength and a significantly lower thermoelectric figure of merit than the bulk material.

We claim:

1. A method of connecting electrical leads to a thermoelectric unit comprising an assembly of thermoelectric elements of P and N type, the elements being stacked in alternating side by side relationship with the faces of the elements at one end of the unit being flush, which method comprises securing to a side of the assembly an electrically conductive member with electrically insulating material interposed between the conductive member and the unit and with one face of the member flush with the faces of the thermoelectric elements at said one end of the unit, forming an electrically conductive bridge from the said one face of the member across to an end face of one of the thermoelectric elements, and connecting adjacent elements conductively to form a circuit arrangement.

2. A method as claimed in claim 1, wherein the electrically conductive bridge is formed simultaneously with the formation of electrically conductive bridges connecting together pairs of the thermoelectric elements as a series of thermocouples in a modular unit.

3. A method as claimed in claim 1, wherein the electrically conductive bridge is provided by gold deposited by vacuum evaporation.

4. A method as claimed in claim 3, wherein the electrically conductive bridge is formed by first superimposing a mask upon the exposed end faces of the thermoelectric elements and the said face of the electrically conductive member, the mask having openings corresponding with the desired location and extent of the electrically conductive bridges, and then forming the electrically conductive bridge by vacuum deposition of gold.

5. A thermoelectric unit comprising an assembly of thermoelectric elements of P and N type, the elements being stacked in alternating side by side relationship with the faces of the elements at one end of the unit being flush, at least one electrically conductive member secured to a side of the thermoelectric unit, insulating material being positioned between the said member and the said thermoelectric assembly, one end face of the said member being flush with the faces of the thermoelectric elements at said one end of the unit, an electrically conductive bridge electrically connecting together the said one face of the member and an end face of one of the thermoelectric elements and an electrically conductive bridge connecting adjacent elements of the assembly into a circuit arrangement.

6. A thermoelectric unit as claimed in claim 5, wherein the unit has two electrical leads connected respectively via two of said electrically conductive members.

7. A thermoelectric unit as claimed in claim 5, wherein the electrically conductive bridges comprise gold.

* * * * *